United States Patent [19]

Young et al.

[11] Patent Number: 5,123,851
[45] Date of Patent: Jun. 23, 1992

[54] INTEGRATED CONNECTOR MODULE WITH CONDUCTIVE ELASTOMERIC CONTACTS

[75] Inventors: Steven Young, Milpitas; Thomas Gilley, Concord; Vijay Char, San Jose, all of Calif.

[73] Assignee: Apple Computer, Inc., Cupertino, Calif.

[21] Appl. No.: 667,420

[22] Filed: Mar. 11, 1991

[51] Int. Cl.$^5$ .............................................. H01R 9/09
[52] U.S. Cl. ..................................... 439/67; 439/91
[58] Field of Search .............. 439/66, 67, 77, 493, 439/329, 79, 86, 91; 29/842, 846, 848, 849, 884

[56] References Cited

U.S. PATENT DOCUMENTS

| | | | |
|---|---|---|---|
| 3,221,286 | 11/1965 | Fedde | 439/493 |
| 3,433,888 | 3/1969 | Tally et al. | 439/67 |
| 3,971,610 | 7/1976 | Buchoff et al | 439/75 |
| 4,116,517 | 9/1978 | Selvin et al | 439/67 |
| 4,453,795 | 6/1984 | Moulin | 439/361 |
| 4,695,258 | 9/1987 | Hanson et al. | 439/329 |
| 4,861,272 | 8/1989 | Clark | 439/79 |
| 4,991,290 | 2/1991 | MacKay | 29/884 |

OTHER PUBLICATIONS

IBM Bulletin, Dunman, vol. 7, No. 3, p. 182, Aug. 1964.

*Primary Examiner*—Neil Abrams
*Attorney, Agent, or Firm*—Blakely, Sokoloff, Taylor & Zafman

[57] ABSTRACT

An electrical connector that electrically couples a circuit board to another electrical device. The connector has a flexible circuit board with at least one electrical conductor that is attached to a flexible dielectric sheet. Attached to the electrical conductor is an electrically conductive elastomer adapted to engage conductive pads on the surface of the circuit board. The connector has a plate or other member that presses the conductive elastomer onto the conductive surface pads, creating an electrical path between the conductor and the circuit board. The conductor is attached to the electrical device, wherein the electrical device is electrically coupled to the circuit board.

5 Claims, 3 Drawing Sheets

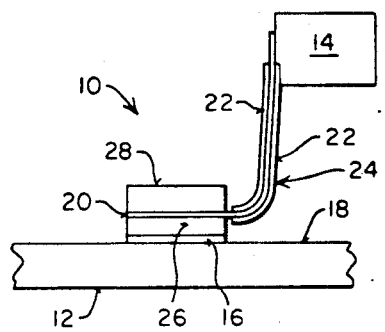
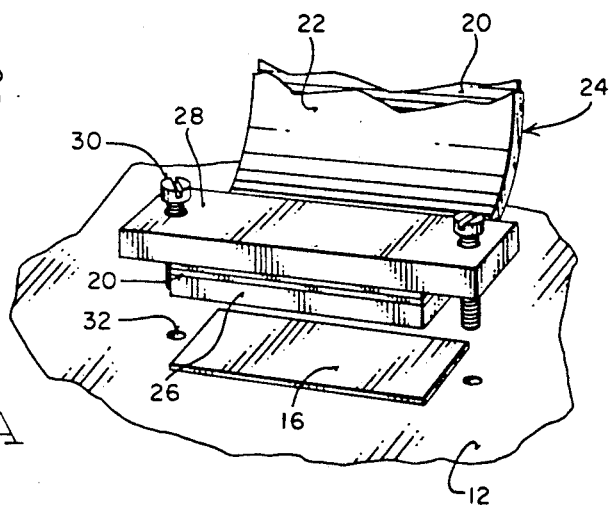
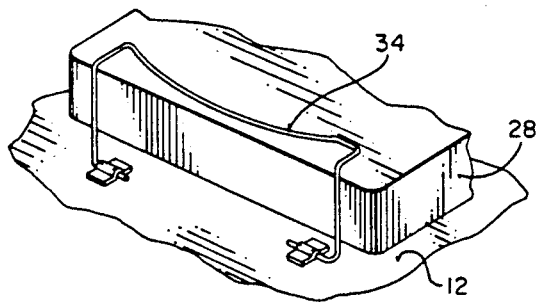
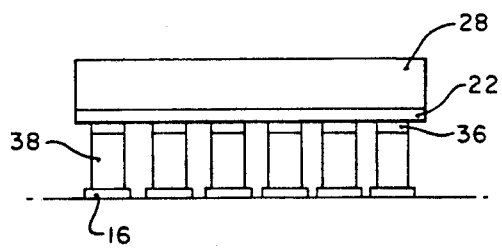
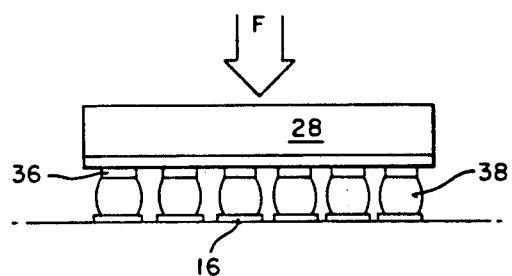

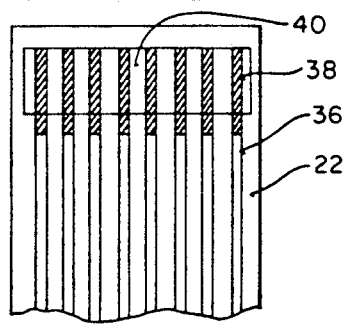
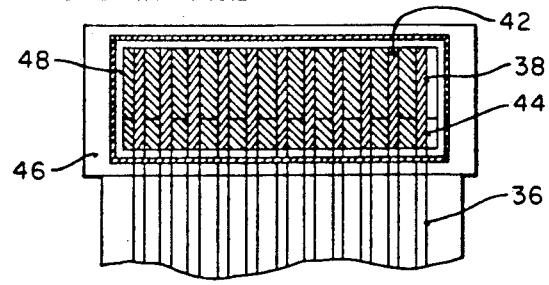
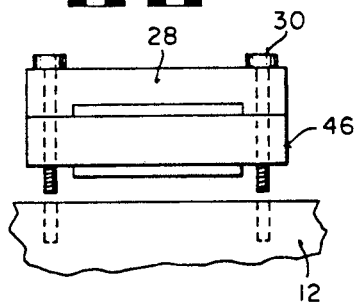
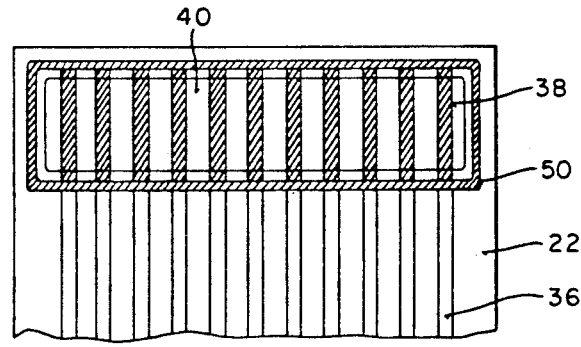
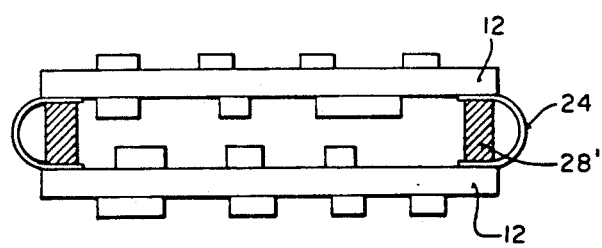
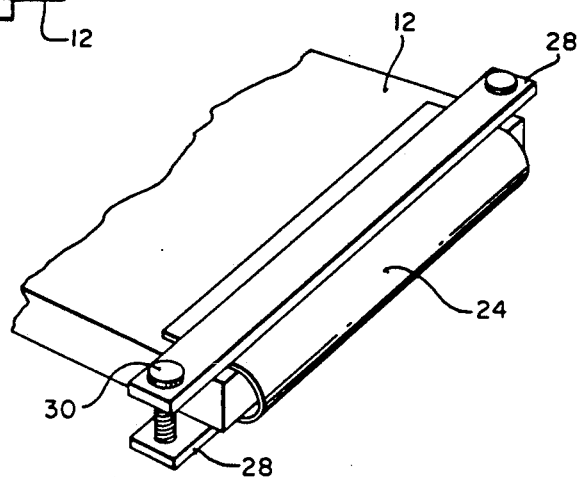

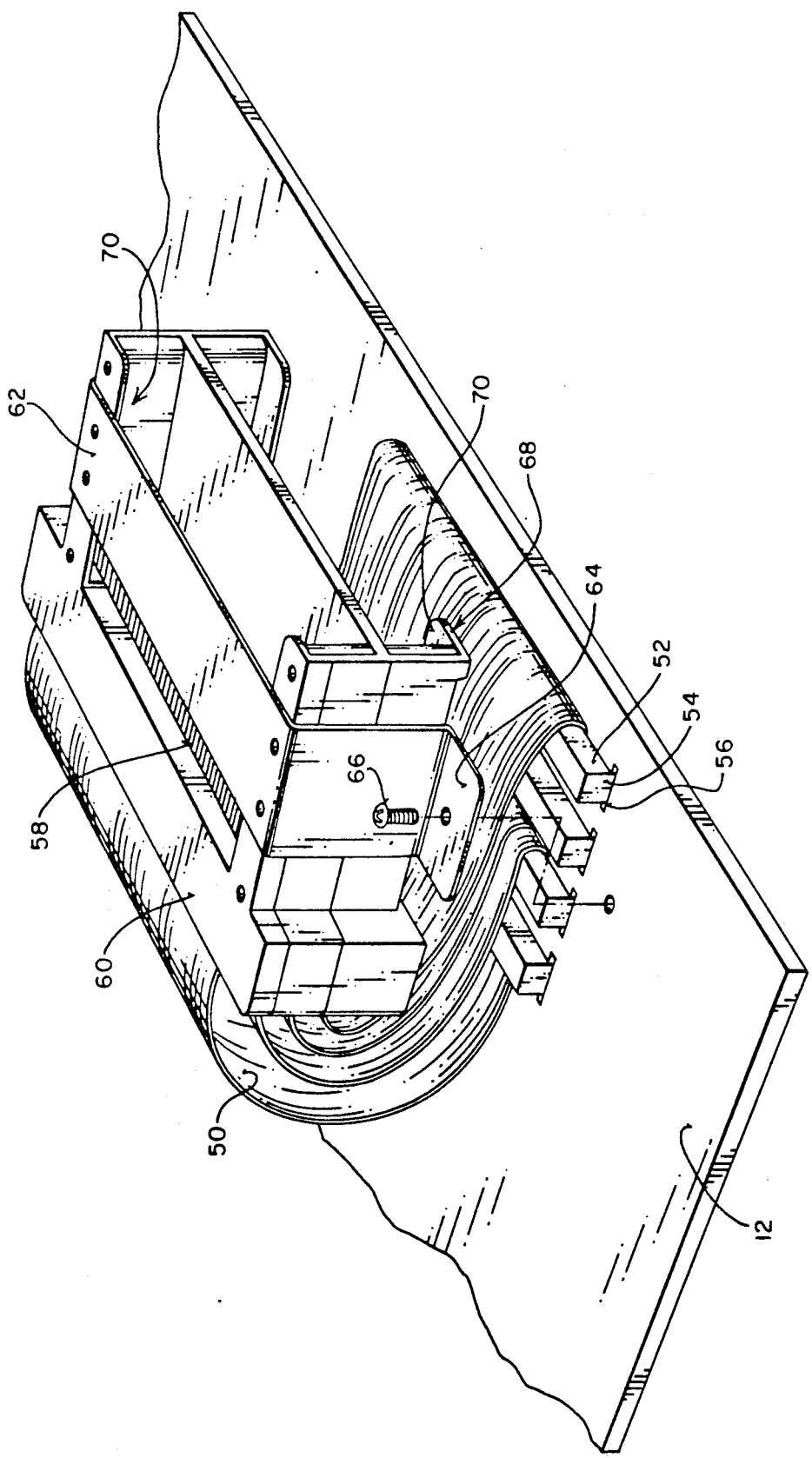
FIG_9

INTEGRATED CONNECTOR MODULE WITH CONDUCTIVE ELASTOMERIC CONTACTS

BACKGROUND OF THE INVENTION

1. Field of the Invention

The present invention relates to electrical connectors used to electrically couple two electronic boards or devices together.

2. Description of the Related Art

Computers or other similar type electronic systems will typically have discrete electrical devices soldered to printed circuit boards (PCB's). The devices are usually packaged in plastic carriers that have copper leads' which extend through the printed circuit boards, to provide an electrical connection between the device and the PCB. Routing space for the conductors within the PCB is reduced because the lines must go around the leads extending through the board. To increase routing density, methods have been devised to mount the devices onto the surface of the PCB's, without the extended leads and accompanying plated through holes in the boards. One common method of surface mounting components, is to provide electrically conductive pads on the surface of the PCB and wave soldering the components to the pads. Because there are no leads extending through the board it is now possible to mount components on both sides of the board, greatly increasing the electronic density of the board.

An assembled PCB will typically communicate with other electrical devices such as a computer keyboard, a printer, or another board. This is usually done with a pair of mating connectors, wherein the connectors have electrically conductive leads that are soldered to the PCB. The leads are wave soldered to the boards in the same manner as the components. Usually the connector is attached to the PCB after the components have already been soldered to the board. To solder the connector, the whole board must be raised to the solder melting point. When a connector is soldered to a board with components on both sides, the components of the board facing down fall off the board. Additionally, every time the board is subjected to wave soldering the PCB is degraded, especially the surface pads. It is therefore desirable to have an electrical connector that can interconnect a PCB and another electrical device without soldering the conductors to the PCB. Repairing the connector is also difficult, wherein the board must again be reflowed. This requires moving the board to a wave solder machine, which is large, expensive and usually only found in manufacturing facilities. It would be preferable to remove the connectors "on site", without the need for a soldering device.

The ever increasing capacity of integrated circuits and routing of the PCB's has greatly increased the input/output (I/O) requirements of the connectors. Standard connectors are typically constructed with 0.100 inch centers, with some "high density" connectors having 0.050 inch centers. It has been found that such connectors are insufficient to handle the I/O requirements of some of the present computer systems being designed. It would therefore be desirable to have a connector that has spacing lower than 0.050 inches.

SUMMARY OF THE INVENTION

The present invention is an electrical connector that electrically couples a circuit board to another electrical device. The connector has at least one electrical conductor that is attached to a flexible dielectric sheet to form a flexible circuit board commonly known as a "flex-circuit". Attached to the electrical conductors is an electrically conductive elastomer adapted to engage conductive pads on the surface of the circuit board. The connector has a plate or other member that presses the conductive elastomer onto the conductive pads, creating an electrical path between the conductors and the circuit board. The conductor is attached to the electrical device, wherein the electrical device is electrically coupled to the circuit board.

The elastomer is typically made from silicon rubber that has a predetermined amount of electrically conductive material. When the rubber is compressed, the density of the conductive filler increases such that the rubber becomes an electrical conductor. The plate can be screwed onto the circuit board to apply pressure to the conductive elastomer to couple the board and the device. The circuit board can then be disconnected by merely unscrewing the screws and removing the board. The other electrical device can be another circuit board or a standard pin or card edge connector.

The use of a flex circuit allows the conductors to be spaced on 0.010 inch centers, which greatly increases the I/O capability of the connector and the routing density of the PCB.

Therefore it is an object of this invention to provide an electrical connector that has an electrical interface that is not soldered to a circuit board.

It is also an object of this invention to provide an electrical connector that provides a spacing density of 0.010 inches.

It is also an object of this invention to provide an electrical connector that has a low profile.

It is also an object of this invention to provide an electrical connector that allows the connector to be removed from an circuit board without using a soldering device or heating any portion of the board thereof.

BRIEF DESCRIPTION OF THE DRAWINGS

The objects and advantages of the present invention will become more readily apparent to those skilled in the art after reviewing the following detailed description and the accompanying drawings, wherein:

FIG. 1 is a diagrammatical side view of an electrical connector of the present invention;

FIG. 2 is a perspective view of an electrical connector showing a conductive elastomer attached to a conductor, such that the elastomer can be pressed onto a surface pad by a plate screwed into a circuit board;

FIG. 2a is a perspective view showing a portion of a plate that is attached to a circuit board by a clip;

FIG. 3 is a side view of an electrical connector showing conductive elastomeric strips attached to individual conductors of a flexible circuit board;

FIG. 4 is a side view similar to FIG. 3 showing the conductive elastomeric strips pressed onto surface pads of a circuit board;

FIG. 5a is a top view of a flexible circuit board with a plurality of conductive elastomeric strips attached to conductors exposed by a window cut into the dielectric sheet of the flexible circuit board;

FIG. 5b is a bottom view of a retaining block that holds an elastomeric block comprising adjacent layers of conductive and nonconductive elastomeric strips;

FIG. 5c is a side view of a retaining block attached to a plate by screws that thread into a circuit board and compress the elastomeric block with the retaining block;

FIG. 6 is a top view of a flexible circuit board similar to FIG. 5a, showing an environmental rubber seal attached to the flexible circuit;

FIG. 7 is a side view of two surface mounted circuit boards electrically coupled by electrical connectors of the present invention;

FIG. 8 is a perspective view of a portion of a circuit board showing both sides of the board electrically coupled by an electrical connector of the present invention;

FIG. 9 is a perspective view of a connector module that has a block that houses a pin connector which is attached to a plurality of connectors of the present invention, the block has a pair of screws to attach the block to a circuit board and to apply pressure to elastomeric strips under the flexible circuit boards.

DETAILED DESCRIPTION OF THE INVENTION

Referring to the drawings more particularly by reference numbers, FIG. 1 shows a basic embodiment of an electrical connector 10 of the present invention. The connector 10 electrically couples a circuit board 12 to another electrical device 14. The circuit board 12 will typically have surface mounted components attached to both sides of the board 12, with electrically conductive pads 16 on the surface 18 thereof. The pads 16 are attached to conductive lines that ultimately connect with the components. The pads 16 are preferably etched from copper and then plated with gold. The other device 14 can be another circuit board with the same assembly of components and pads as described above.

The connector 10 has at least one electrical conductor 20, preferably constructed from copper, that is attached at one end to the electrical device 14. On each side of the conductor 20 are sheets of flexible dielectric material 22 that is sold by E. I. DuPont de Nemours & Co. under the trademark KAPTON. The flexible dielectric 22 and conductor 20 form a flexible circuit board 24 commonly known in the art as a flex-circuit. Attached to the other end of the conductor 20 is an electrically conductive elastomer 26. Opposite the elastomer 26 is a plate 28 that applies a pressure to the conductor 20 and elastomer 26, pressing the elastomer 26 onto the surface pad 16 of the circuit board 12. The elastomer 26 is preferable constructed from rubber that has a predetermined amount of electrically conductive material, such that when the elastomer 22 is compressed it becomes electrically conductive. The electrically conductive material can be metal particles, minute wires, carbon fibers or small springs that are interposed throughout the rubber. Without being limited by the theory thereof, it is believed that when the rubber is compressed, the density of the conductive material increases such that the fibers, etc. come into contact with each other to create an electrical path through the elastomer. A spring filled elastomer is preferred in that it has been found that this particular type of elastomeric conductor has the lowest electrical resistance, typically on the order of 0.1 ohms/cm. Silicon rubber is preferred, because silicon is resistive to many types of chemicals and silicon rubbers do not permanently set when compressed by pressures typically seen in this application.

As shown in FIG. 2, the elastomer 26 can be compressed by attaching the plate 28 to the circuit board 12, with a pair of screws 30 that screw into a pair of threaded apertures 32 in the board 12. The pressure of the plate 28 can be adjusted by turning the screws 30 and moving the plate 28 relative to the circuit board 12. Although screws 30 are shown it is understood that other means of applying pressure to the elastomer 22 can be employed. For example, metal clips 34 can be incorporated that rotate and fasten the plate 28 to the board 12 as shown in FIG. 2a. These types of fasteners are known in the art and provide a quick way of attaching and detaching the connector 10. FIGS. 3 and 4 show a more preferred embodiment of the conductor 20, wherein the copper is constructed into a plurality of conductive leads 36. Each conductive lead is coupled to a corresponding conductive pad 16. The individual leads 36 would be ideally used to transmit digital signals. Attached to each conductor 36 is a conductive elastomeric strip 38 that engages the surface pads 16 of the circuit board 12. The elastomer 38 is of such thickness and having a modulus of rigidity, such that a minimal force is needed to compress the rubber sufficiently to create an electrical path between the surface pads 16 and the conductors 36. For example it has been found that for conductor leads 0.005 inches wide, the elastomeric strips 38 should be approximately 0.125 inches thick. The .005" wide conductors 38 allow the connector 10 and surface pads 16 to be constructed with .010 inch centers. As shown in FIG. 4, the elastomeric strips 36 will increase in width or bulge when compressed. The spacing between conductors 36 and strips 38 should be such that there is a sufficient gap between the strips 38 to prevent shorting of adjacent conductors 36. The dielectric 22 provides electrical insulation between the conductors 38 and the plate 28, so that the plate 28 can be constructed from metal. It is preferable to have a stiff plate so that the forces applied at the ends as shown in FIGS. 2 and 2a, translate across the plate, to insure that the pressure on each strip across the length of the plate is approximately the same. FIG. 5a shows a pattern of conductors 36 in a flex-circuit 24. The conductors 36 are encapsulated by two sheets of KAPTON, wherein a window 40 is cut into one sheet of the KAPTON to expose a portion of the conductors 32. The elastomeric strips 38 are then attached to the exposed conductors 32 by bonding a portion 44 of the strips 38 to the KAPTON 22 outside the window 40. FIGS. 5b and 5c show a preferred embodiment that has an elastomeric block 42 attached to the window 40 of the flex-circuit 24. The elastomeric block 42 comprises a plurality of conductive elastomeric strips 38 adjacent and attached to a plurality of nonconductive elastomeric strips 44. Such an elastomeric block 42 is sold by Fujipoly, Inc. under the trademark ZEBRA. The nonconductive strips 44 provide structural support and electrical insulation for the conductive strips 38. The elastomeric block 42 can be held in place by a retaining block 46 with a cavity 48 of such dimension to hold the elastomers. The housing 46 can be attached to the plate 28 by screws 30 that extend through the plate 28 and housing 46 as shown in FIG. 5c. The screws 30 thread into the circuit board 12 pressing the elastomeric block 42 against the conductive pads 16. To provide environmental protection, an annular ring 50 of nonconductive rubber can be attached to the flex-circuit 24 outside the window 40, as shown in FIG. 6. The ring 50 could be formed with the individual elastomeric strips 38 or with an elastomeric block 42 for ease of assembly. The annular ring 50 is also compressed by the plate 28, such that the strips 38 are sealed from the environment. The pressure of the seal 50 should be such to prevent fluid or gaseous communication between the elastomeric strips 38 and the area outside the seal 50. With this embodiment, condensation or other foreign matter can not enter the region of the strips 38 and electrically short circuit the conductors 36.

FIGS. 7 and 8 show alternate uses of the connector of the present invention. FIG. 7 shows the interconnection of two circuit boards 12, both having surface mounted components. The boards 12 are electrically coupled by flex-circuits 24 similar to that shown in FIG. 5a, wherein elastomeric strips 38 are attached to exposed conductors 36 on both ends of the circuit 24. The strips 38 engage conductive pads 16 that are etched into the surface of the boards 12. Plates 28' can be interposed between the ends of the circuit 24. The boards 12 are pressed together compressing the strips 38 onto the pads 16 of each board 12. This arrangement allows for easy disconnection of the boards 12, without heating the boards as was done in the prior art. The present connector 10 also provides a lower profile than present pin connectors that are typically used today. The spacing between the boards 12 now only being limited by the height of the components mounted on the boards 12. This greatly increases the overall density of the electronic assembly. FIG. 8 shows another use of the connector wherein the flex-circuit 24 electrically couples both sides of a board 12. This is particularly useful when components are mounted on both sides of a board 12 and each side must communicate with one another. The elastomeric strips 38 can be compressed by two plates 24 bolted together by a pair of screws 30. The connector of FIG. 8 could be modified such that the flex-circuit has plated through holes in the center adapted to attach to the leads of a standard pin connector. Such a connector interface would allow a standard pin connector to be removed from a board, without locally heating the board to remove the soldered leads of the connector from the board.

FIG. 9 shows another embodiment of the present invention. Flex circuits 50 constructed as shown in FIG. 5a, are attached to the bottom of plates 52 that induce contact between elastomeric strips and surface pads on the circuit board 12. The plates 52 have flanges 54 that are inserted into slots 56 in the board that align the conductive elastomeric strips with the conductive pads. The other end of the flex-circuits 50 are soldered to connectors 58 that are housed in a connector block 60. The connectors 58 typically being standard pin or card edge electrical connectors. Attached to the block 60 is a plate 62 with a pair of flanges 64 and screws 66 that bolt the block 60 to the circuit board 12. As an alternative to the plate 62, the block 60 could be constructed to have flanges. The bottom of the block 68 engages both ends of the plates 52 and applies pressure to the elastomeric strips when the block 60 and board 12 are attached. The block 60 can have four channels 70 that define two trays that allow mating connectors to be plugged into the connectors 58 housed in the block 60. Typically each tray will have a single connector, wherein the channels 70 guide the mating connectors together. The channels 70 could also have keying features to prevent the wrong connector from making contact with the connector in block 60. Thus what is disclosed is a connector module that can be readily detached from a circuit board without having to heat the board as is presently done in the art. This greatly increases the repairability and life of the board, allowing a circuit board to be easily removed from a computer by merely unscrewing two screws 66. The module of this embodiment is preferably used to connect an I/O card to external devices such as a printer.

While certain exemplary embodiments have been described in detail and shown in the accompanying drawings, it is to be understood that such embodiments are merely illustrative of, and not restrictive on the board invention, and that this invention not be limited to the specific constructions and arrangements shown and described since various other modifications may occur to those ordinarily skilled in the art.

What is claimed is:

1. A connector module that electrically couples a circuit board having at least one conductive pad to an electrical device, comprising:
   a flexible circuit board having at least one conductor attached to a flexible dielectric sheet, said conductor having a first and second end;
   at least one conductive elastomeric strip attached to said first end of said conductor, constructed to provide an electrical path between said conductor and the conductive pad when pressure is applied to said conductive elastomeric strip;
   a least one plate operatively connected to said flexible circuit board;
   at least one electrical connector attached to said second end of said conductor;
   a connector block constructed to house said electrical connector, said block having a first surface adapted to engage said plate and apply pressure to said conductive elastomeric strip; and,
   attachment means for attaching said connector block to the circuit board, said attachment means providing a force on said connector block and said plate such that said plate applies pressure to said conductive elastomeric strip creating said electrical path between said conductor and the conductive pad of the circuit board.

2. The module as recited in claim 1, wherein there are a plurality of conductive pads on the circuit board coupled to a plurality of corresponding conductors by a plurality of conductive elastomeric strips.

3. The module as recited in claim 2, wherein there are two connectors each having a pair of flexible circuit boards, each flexible circuit board having a corresponding plate.

4. The module as recited in claim 3, wherein said attachment means includes a pair of screws that extend through said connector block and screw into threaded apertures in the circuit board.

5. The module as recited in claim 4, wherein said block has a slot adapted to receive the electrical device such that the electrical device is coupled to said connector.

* * * * *